(12) United States Patent
Timpson et al.

(10) Patent No.: US 11,961,896 B2
(45) Date of Patent: Apr. 16, 2024

(54) DIAMOND-LIKE CARBON COATING FOR PASSIVE AND ACTIVE ELECTRONICS

(71) Applicant: Honeywell Federal Manufacturing & Technologies, LLC, Kansas City, MO (US)

(72) Inventors: Erik Joseph Timpson, Lee's Summit, MO (US); Justin M. Schlitzer, Stillwell, KS (US); Thomas Matthew Selter, Blue Springs, MO (US); Michael Walsh, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 108 days.

(21) Appl. No.: 17/474,879

(22) Filed: Sep. 14, 2021

(65) Prior Publication Data

US 2023/0083860 A1    Mar. 16, 2023

(51) Int. Cl.
*H01L 29/49*    (2006.01)
*H01L 29/51*    (2006.01)
*H01L 29/84*    (2006.01)
*H01L 29/868*   (2006.01)

(52) U.S. Cl.
CPC .......... *H01L 29/51* (2013.01); *H01L 29/4916* (2013.01); *H01L 29/84* (2013.01); *H01L 29/868* (2013.01)

(58) Field of Classification Search
CPC ........... C23C 28/343; H01L 29/45–458; H01L 29/43–518; H01L 29/86–885
See application file for complete search history.

(56) References Cited

U.S. PATENT DOCUMENTS

| | | | |
|---|---|---|---|
| 5,196,907 A * | 3/1993 | Birkle | H01L 29/51 257/E21.048 |
| 5,541,566 A | 7/1996 | Deeney | |
| 5,638,251 A * | 6/1997 | Goel | H01G 4/08 427/249.7 |
| 6,086,796 A | 7/2000 | Brown et al. | |
| 6,780,517 B2 | 8/2004 | Chen et al. | |

(Continued)

OTHER PUBLICATIONS

"Surface, microstructure and optical properties of copper-doped diamond-like carbon coating deposited in pulsed cathodic arc plasma" in Diamond & Related Materials 42 (2014) 64-70 to Alexander S. Chaus et al. (Year: 2014).*

(Continued)

*Primary Examiner* — Eric A. Ward
(74) *Attorney, Agent, or Firm* — Erise IP, P.A.

(57) ABSTRACT

Systems and methods for building passive and active electronics with diamond-like carbon (DLC) coatings are provided herein. DLC may be layered upon substrates to form various components of electronic devices. Passive components such as resistors, capacitors, and inductors may be built using DLC as a dielectric or as an insulating layer. Active components such as diodes and transistors may be built with the DLC acting substantially like a semiconductor. The amount of $sp^2$ and $sp^3$ bonded carbon atoms may be varied to modify the properties of the DLC for various electronic components.

20 Claims, 8 Drawing Sheets

(56) References Cited

U.S. PATENT DOCUMENTS

| | | | |
|---|---|---|---|
| 7,355,247 B2* | 4/2008 | Shaheen | H01L 29/78681 257/349 |
| 8,227,812 B2 | 7/2012 | Sung | |
| 8,760,844 B2 | 7/2014 | Baron et al. | |
| 8,947,826 B2 | 2/2015 | Bhatia et al. | |
| 10,569,330 B2 | 2/2020 | King et al. | |
| 2007/0132375 A1* | 6/2007 | Bachmann | H10K 50/8445 313/506 |
| 2007/0148888 A1* | 6/2007 | Krull | H01L 29/7848 257/E21.336 |
| 2010/0059762 A1* | 3/2010 | Hossain | H01L 21/7624 438/455 |
| 2010/0320535 A1* | 12/2010 | Schmidt | H01L 29/872 257/341 |
| 2019/0009330 A1 | 1/2019 | King et al. | |
| 2019/0077125 A1 | 3/2019 | Lorenzetti et al. | |
| 2019/0140100 A1* | 5/2019 | Wang | H01L 29/78606 |
| 2019/0206608 A1 | 7/2019 | Salz et al. | |
| 2020/0378011 A1 | 12/2020 | Hendrix et al. | |
| 2021/0159332 A1* | 5/2021 | Zhaomeng | H01L 29/66689 |

OTHER PUBLICATIONS

"Studies of phosphorus doped diamond-like carbon films" in Diamond and Related Materials 9 (2000) 1222-1227 to M-T. Kuo et al (Year: 2000).*

"Electrical characterization of metal/diamond-like carbon/inorganic semiconductor MIS Schottky barrier diodes" in Microelectronic Engineering 140 (2015) 18-22 to N. Basman et al. (Year: 2015).*

R. L. C. Wu, H. Kosai, M. Freeman, G. E. Schwarze, S. F. Carr and J. A. Weimer, "Thin film diamond-like carbon dielectrics," Conference Record of the Twenty-Fifth International Power Modulator Symposium, 2002 and 2002 High-Voltage Workshop., 2002, pp. 282-285, doi: 10.1109/MODSYM.2002.1189471.

* cited by examiner

DIAMOND-LIKE CARBON COATING FOR PASSIVE AND ACTIVE ELECTRONICS

STATEMENT OF GOVERNMENTAL SUPPORT

This invention was made with government support under DE-NA0002839 awarded by the United States Department of Energy/National Nuclear Security Administration. The government has certain rights in the invention.

BACKGROUND

1. Field

Embodiments of the invention relate to a system and process for building electronic components. More specifically, embodiments of the invention relate to a system and process for building passive and active electronic components using diamond-like carbon (DLC) coatings.

2. Related Art

The general use of DLC in electronics is known. U.S. Pat. No. 10,569,330 to King et al. discloses passive electronics coated with DLC to protect against degradation. U.S. Pat. No. 5,541,566 to Deeney describes an electromagnetic switch that includes strips of magnetic material separated by a diamond-like, polycrystalline carbon coating to improve cooling of the core of the electromagnetic switch. U.S. Pat. No. 8,227,812 to Sung describes using a DLC conformal coating in a cathode or anode. U.S. Pat. No. 5,638,251 to Goel et al. discloses using diamond-like nanocomposite materials as a dielectric. U.S. Pat. No. 8,760,844 to Baron et al. also discloses using DLC as a dielectric when used with a capacitor. U.S. Patent Application Publication No. 2019/0206608 to Salz et al. describes coating passive electronics with a layer of DLC to improve the durability of the passive components.

SUMMARY

Embodiments of the invention are generally directed to systems and methods for manufacturing passive and electronic components including diamond-like carbon (DLC) coatings. DLC coatings may act as a semiconductor and/or an electrical insulator depending on the thickness and other properties of the coating. DLC may be used in constructing smaller electronics than can be made using typical materials, such as silicon.

A first embodiment is directed to a transistor comprising a body region having a first end and a second end opposite the first end, a source terminal connected to the first end of the body region, a drain terminal connected to the second end of the body region, a diamond-like carbon layer (DLC) disposed between the source terminal and the drain terminal, and a gate terminal comprising a gate electrode. The source terminal and the drain terminal are configured such that electrons flow bidirectionally from the source terminal to the drain terminal, the DLC layer provides electrical insulation between the source terminal and the drain terminal, and the gate terminal is disposed onto the DLC layer such that the gate terminal is insulated from the body.

A second embodiment is directed to a diode comprising a first electrical contact, a DLC layer deposited onto the first electrical contact, a p-type semiconducting region deposited onto the DLC layer, and a second electrical contact deposited onto the p-type semiconducting region. The DLC layer comprises DLC doped with an n-type semiconducting material to provide an n-type semiconducting region.

A third embodiment is directed to a transducer comprising a substrate, a first bonding pad disposed on a first portion of the substrate, a DLC layer having a first end, a second end opposite the first end, and a middle region connecting the first end to the second end, and a second bonding pad disposed on the DLC layer. The first end is configured to contact the first bonding pad, the second end is configured to contact the substrate, and the middle region is configured to be substantially thinner than the first end and the second end such that there is a space between the middle region and the substrate. The DLC layer is configured to deform when a mechanical force is applied to the transducer, and the first bonding pad and the second bonding pad are conductive such that a charge is carried from the second bonding pad through the DLC layer and through the first bonding pad when the force is applied.

Another embodiment is directed to an electronic component, comprising a base layer of DLC deposited onto a substrate, a masking layer applied to the base layer, at least one layer of an electronic component material applied to the masking layer, and at least one additional layer comprising DLC deposited onto the at least one layer of the electronic component material to form the electronic component. The masking layer is removed after the at least one layer of the electronic component material is applied.

Another embodiment is directed to an electronic component comprising a base layer comprising DLC deposited onto a substrate, a layer of an electronic component material deposited onto a portion of the base layer, and at least one additional layer comprising DLC deposited onto the layer of the electronic component material to form the electronic component. The DLC is formed to have a predetermined ratio of $sp^2/sp^3$ bonded carbon atoms.

Another embodiment is directed to a method for building an electronic component using layers of diamond-like carbon coating, comprising: providing a substrate for building the electronic component thereon, depositing a base layer comprising DLC onto the substrate, applying a masking layer to the substrate to mask at least a portion of the base layer, depositing an electronic component material onto the substrate such that the electronic component material is deposited onto an unmasked portion of the substrate, and depositing at least one additional layer comprising DLC onto the substrate to form the electronic component.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
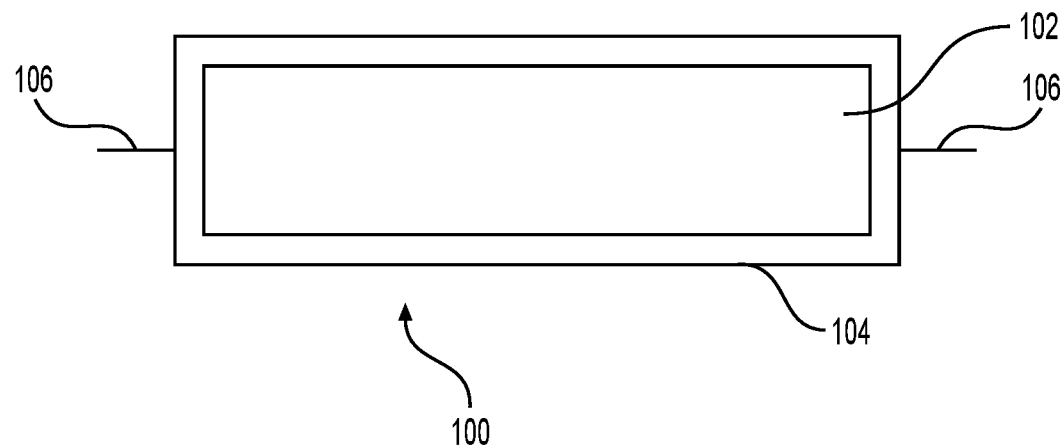
FIG. 1 illustrates a resistor built with DLC for certain embodiments.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

Diamond-like carbon (DLC) is a class of amorphous carbon having similar properties to diamond. Different forms of DLC may exist based on an amount of $sp^2$ and $sp^3$ crystalline polytypes of bonded carbon atoms, in which $sp^2$ bonded carbon atoms have a cubic lattice (graphite) providing low friction, and $sp^3$ bonded carbon atoms have a hexagonal lattice (diamond) providing high hardness. The $sp^2/sp^3$ ratio may be altered depending on how the DLC coatings are formed and/or by doping the DLC material, as further described below.

One form of DLC is known as tetrahedral amorphous carbon (ta-C) and comprises only $sp^3$ bonded carbon atoms or predominantly $sp^3$ bonded carbon atoms. In some embodiments, the ta-C form of DLC allows for the DLC to act substantially like a semiconductor despite the non-crystalline structure of the DLC. In the ta-C form of DLC, electricity may pass through the DLC via hopping conductivity in which electrons move by quantum mechanical tunneling between pockets of conductive material isolated in an insulator, thus allowing the ta-C form of DLC to function like a semiconductor. Other forms of DLC comprise a higher portion of $sp^2$ and $sp^3$ bonded carbon atoms. In some embodiments described herein, the $sp^2/sp^3$ ratio of the DLC mixture may be varied depending on the electronic component being built. For example, in some embodiments, a semiconductor built with DLC may be designed to have a lower ratio of $sp^2/sp^3$. Additionally, in some embodiments, DLC that is to be used as a dielectric may be designed to have a higher $sp^2/sp^3$ ratio. In some embodiments, the hydrogen content of the DLC is also modified. Increasing the hydrogen content may lead to a decrease in conductivity of the DLC and an increase in the transmissivity of the DLC. In some embodiments, the hydrogen content may be varied during the deposition process.

In some embodiments, DLC is formed by depositing layer upon layer of carbon atoms onto the substrate via chemical-vapor deposition (CVD), plasma-enhanced CVD (PECVD), ion beam deposition (also referred to herein as ion beam sputtering), filtered cathodic vacuum arc deposition, or any combination thereof. With CVD, volatile hydrocarbons are provided in a low-pressure or high-vacuum chamber for depositing on the substrate. For PECVD, radio-frequency (RF) energy may be used to form a plasma in which gas molecules are ionized into their atomic constituents, such that hydrocarbons become ionized hydrogen and carbon atoms. For ion beam deposition, an ion beam source (e.g., a cathodic arc source) is used to ionize material and direct the material to a target location on the substrate. In some embodiments, the $sp^2/sp^3$ ratio is influenced by the DLC deposition method. For example, DLC having a high $sp^2/sp^3$ ratio may be achieved using plasma-enhanced chemical vapor deposition (PECVD) or ion-beam sputtering or both. A low $sp^2/sp^3$ ratio may be achieved using other deposition methods, such as filtered cathodic vacuum arc depositions. In some embodiments, a biased stage and substrate may be used to draw charged particles to a deposition area. For example, a stage could be negatively charged to attract positively charged ions. In some embodiments, the $sp^3$ content of the DLC is in the range of about 45% to about 65%, and the hydrogen content of the DLC is in the range of about 20% to about 35%. However, other ranges of $sp^2/sp^3$/Hydrogen may be employed without departing from the scope hereof. In some embodiments, the DLC layer is in the ta-C region of DLC. In some embodiments, the DLC is in the a-C (amorphous hydrogenated carbon) region of DLC.

In some embodiments, passive and/or active electronic components are built in part by applying multiple layers of DLC. Passive electronic components such as resistors, capacitors, and inductors may be built by utilizing DLC as an insulating or dielectric layer. Active components such as switches, diodes, transistors, transducers, and sensors may be built by applying layers of DLC in appropriate locations on each component. For example, DLC may be mixed with an n-type semiconducting material to build a p-n junction diode. When used to build active components, DLC may function substantially similar to a semiconductor. In some embodiments, the DLC layers are deposited at a thickness less than about 5 microns thick. In some embodiments, the DLC layers are about 1 micron thick to about 3 microns thick. In other embodiments, the DLC layers are sub-micron thick (e.g., about 0.1 micron to about 0.9 micron thick).

In some embodiments, passive and active electronic components are built by substantially replacing silicon that is typically present in the electronic components with at least one layer of DLC. Consequently, the resulting passive and DLC electronic components may be smaller than their silicon counterparts because silicon is atomically larger than carbon. Passive and active electronics built with DLC may be used in various applications to also take advantage of the inherent tribological properties of DLC. DLC is often used as a lubricant for various components due to its low coefficient of friction. In some embodiments, transducers may be built with DLC to provide a dual-use lubricated sensor, for example. In some embodiments, a coating of DLC itself may act as a transducer, as will be discussed further.

FIG. 1 illustrates a resistor 100 for some embodiments. Resistor 100 may comprise resistor body 102, DLC 104, and lead lines 106. In some embodiments, resistor 100 is one of a carbon resistor, a printed carbon resistor, a thin film resistor, a tantalum resistor, or a cermet resistor. Resistor body 102 may comprise a material such as carbon, nickel-chromium alloy, a metal oxide (e.g., tin oxide), or any other resistive material. In some embodiments, resistor body 102 comprises a cermet such as tantalum nitride, ruthenium oxide, lead oxide, bismuth ruthenate, or bismuth iridate. In some embodiments, DLC 104 may be applied and function as insulation for resistor 100. An appropriate thickness of DLC 104 may be applied to produce resistor 100 at the desired resistance value. For example, a resistor 100 having a coating of DLC 104 with a thickness of about 1 micron to about 3 microns may have a resistivity of about $10^7$ Ohm·cm to about $10^{12}$ Ohm·cm. In some embodiments, resistor 100 may be produced having a resistance of about 100 Ohms to about $1·10^{22}$ Ohms. For example, a resistor 100 comprising DLC may have a resistivity of about $1·10^{16}$ Ohms·cm, a length of about 100 cm, and a cross-sectional area of about 0.0001 $cm^2$ may produce a resistance of about 10 zetta-Ohms. By controlling the thickness of DLC 104 using ion beam deposition and/or other deposition methods, the resistance of resistor 100 may be controlled and deposited to extremely tight tolerances. In some embodiments, for example, when resistor 100 is built to have a large resistance, DLC 104 may be coated as insulation before adding shielding to resistor 100. The desired resistance of resistor 100 and the desired shape of resistor 100 may also influence the thickness and geometry of DLC 104. As the amount of DLC 104 enveloping resistor body 102 decreases, the resistance of the resistor 100 may drop.

Figure 2:
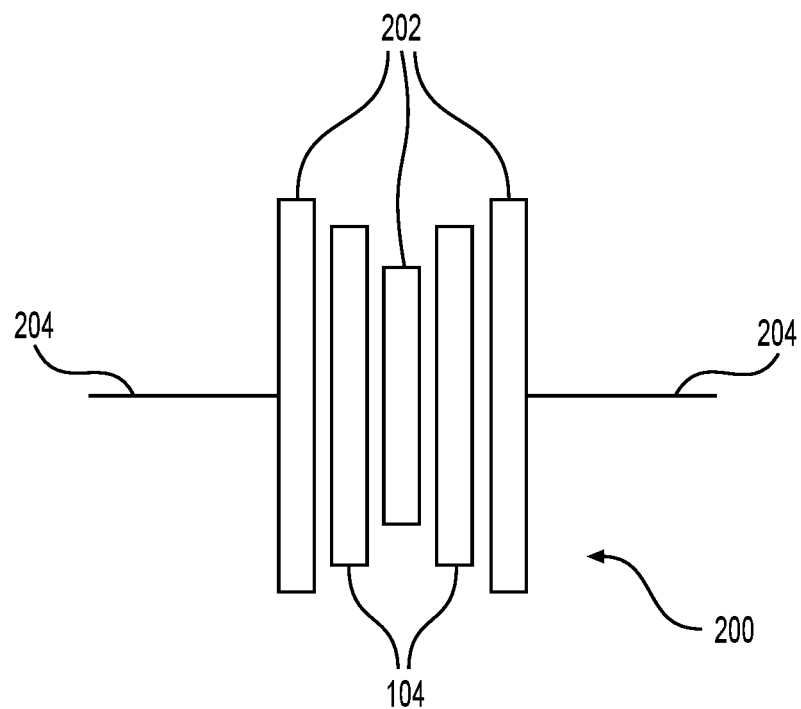
FIG. 2 illustrates a capacitor built with DLC for certain embodiments.

FIG. 2 illustrates a capacitor 200 for some embodiments. As depicted, capacitor 200 is a multilayer capacitor in an exploded configuration. In some embodiments, capacitor 200 comprises capacitive material 202, DLC 104, and lead lines 204. In some embodiments, capacitor 200 is a parallel-plate capacitor with only a single layer of DLC 104 in between two plates of capacitive material 202. In some embodiments, capacitor 200 is an interleaved capacitor or a supercapacitor. Capacitive material 202 may be any capacitive material such as copper, silver, aluminum, tantalum, or various other metals or metal alloys. DLC 104 may serve as the dielectric for capacitor 200. In a supercapacitor arrangement, DLC 104 may act as the insulating separator. Using DLC 104 as a dielectric in capacitor 200 enables production of smaller capacitors with a higher power storage capability compared with conventional capacitors. By increasing the thickness of DLC 104, the dielectric constant of DLC 104 may increase. In some embodiments, the thickness of DLC 104 for capacitor 200 may be in the range of about 5 nanometers to about 50 nanometers. In some embodiments, the thickness of DLC 104 for capacitor 200 may be in the range of about 50 nanometers to about 100 nanometers. In some embodiments, the thickness of DLC 104 for capacitor 200 may be at least about 100 nanometers to about 10 microns to achieve a substantially high dielectric constant. Similar to resistor 100, capacitor 200 may also comprise lead lines 204 for connecting to various other electronic components in a circuit. In some embodiments, capacitor 200 comprises a capacitance of about less than about 1 picofarad to about 1 farad.

By using DLC 104 as the dielectric for capacitor 200, capacitor 200 may be built in-line with various other electronic components in a substrate or printed circuit board. Building capacitor 200 in-line may allow for capacitor 200 to be printed thinner, flatter, and/or wider, and provide for better control of the electrical properties of capacitor 200. Employing DLC 104 as the dielectric in capacitor 200 may also prove advantageous over typical dielectrics, such as polyimide, that are deposited via sputtering, which may lead to an uneven coating.

Figure 3:
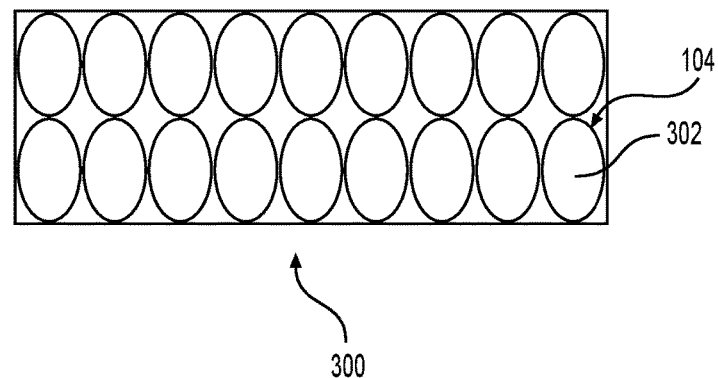
FIG. 3 illustrates an inductor built with DLC for certain embodiments.

FIG. 3 illustrates a cross section of an inductor 300 for some embodiments. Inductor 300 may comprise coils 302 and DLC 104. Inductor 300 may take various shapes such as a spiral, a helix, or a toroidal. Coils 302 may comprise a conducting material such as copper or silver. In some embodiments, inductor 300 is wound about a core (not shown), which may comprise a plastic, ceramic, or a ferromagnetic material. Inductor 300 may be built by coating coils 302 with DLC 104 such that DLC 104 serves as the primary insulating material for coils 302. The achievable thinness of the DLC 104 coating via ion beam deposition, PECVD, and other suitable deposition methods may allow for inductor 300 to achieve a more tightly packed arrangement (i.e., less space between coils 302) than with a polyimide layer or a similar insulating layer. In some embodiments, DLC 104 may be applied having a thickness of about 5 nanometers. Thus, the window utilization factor may be increased for inductor 300 having coils 302 coated with DLC 104, potentially leading to a more effective and efficient inductor 300.

In some embodiments, inductor 300 may be used in pulse power applications, such as electromagnetic propulsion systems, lasers, and high-powered weaponry which require large instantaneous power releases. Often in pulse power applications, it is desired that inductor 300 stays rigid during pulsing. By holding inductor 300 rigid, a different inductance can be obtained than if inductor 300 was allowed to move. However, holding inductor 300 rigid often leads to material stresses on inductor 300 when pulsed due to contact stress caused by coils 302 rubbing together. By coating coils 302 with DLC 104 to serve as the insulation, inductor 300 may be pulsed and not held rigid while achieving an equivalent or better performance than if it was held rigid while using a layer of insulation having a higher friction coefficient. Because DLC 104 may reduce friction between coils 302, the stresses caused by the pulsing of inductor 300 may also be reduced. The increase in inductance from the closer packing of coils achievable by using DLC 104 may also offset or overcome any inductance lost by not holding inductor 300 rigid during pulsing. Likewise, capacitor 200 may be coated with DLC 104 as described above and be pulsed without suffering detrimental stresses to capacitive material 202.

The use of DLC 104 with active electronic components will now be discussed. As described above, active components may comprise electronic switches, diodes, transistors, transducers, variations thereof, and any other electronic component capable of power gain. In some embodiments, DLC 104 can be layered appropriately and used in combination with various materials (e.g., phosphorous and boron) to allow DLC 104 to act substantially like a semiconductor.

Broadly, active components may be constructed using layers of DLC 104 applied in the appropriate location on the active component and at an appropriate thickness to produce the active component with the desired properties and functionality. In some embodiments, DLC 104 is deposited at a thickness of less than about 100 nm or less than about 50 nm to function substantially like a semiconductor. More specifically, DLC 104 may be used to replace silicon in many active electronic components.

Figure 4:
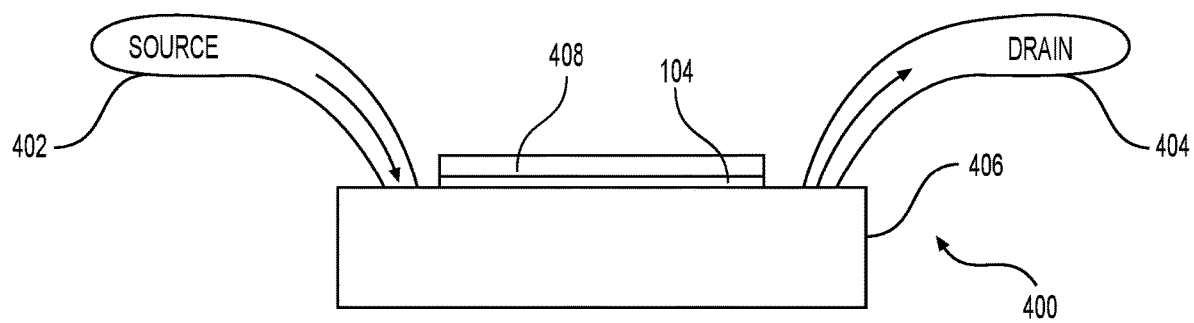
FIG. 4 illustrates a switch built with DLC for certain embodiments.

FIG. 4 illustrates a switch 400 for some embodiments. Switch 400 may comprise any type of switch such as a hand switch, a limit switch, or a MOSFET switch as will be discussed in more detail with respect to FIG. 6. As depicted in the illustrated embodiment, switch 400 comprises source 402, drain 404, body 406, gate 408, and DLC 104. Source 402, drain 404, and gate 408 may serve as terminals for switch 400. In some embodiments, body 406 may comprise DLC 104 and may be doped or otherwise layered with other material, such as boron or phosphorous, to obtain substantially the same properties as a traditional switch made with doped silicon, thus functioning substantially like a semiconductor. In some embodiments, DLC 104 acts as an insulating layer between source 402, drain 404, and gate 408. In some embodiments, DLC can be applied to only a portion of the body 406, such as segment of a top surface, as shown in FIG. 4. In some embodiments, switch 400 works by applying voltage to gate 408 thus forming a channel in body 406. When the channel is formed, electrons can then flow between source 402 and drain 404. When no voltage is applied, switch 400 may be considered to be in an OFF state, and when a voltage is applied to form the channel, switch 400 may be considered to be in an ON state.

Figure 5:
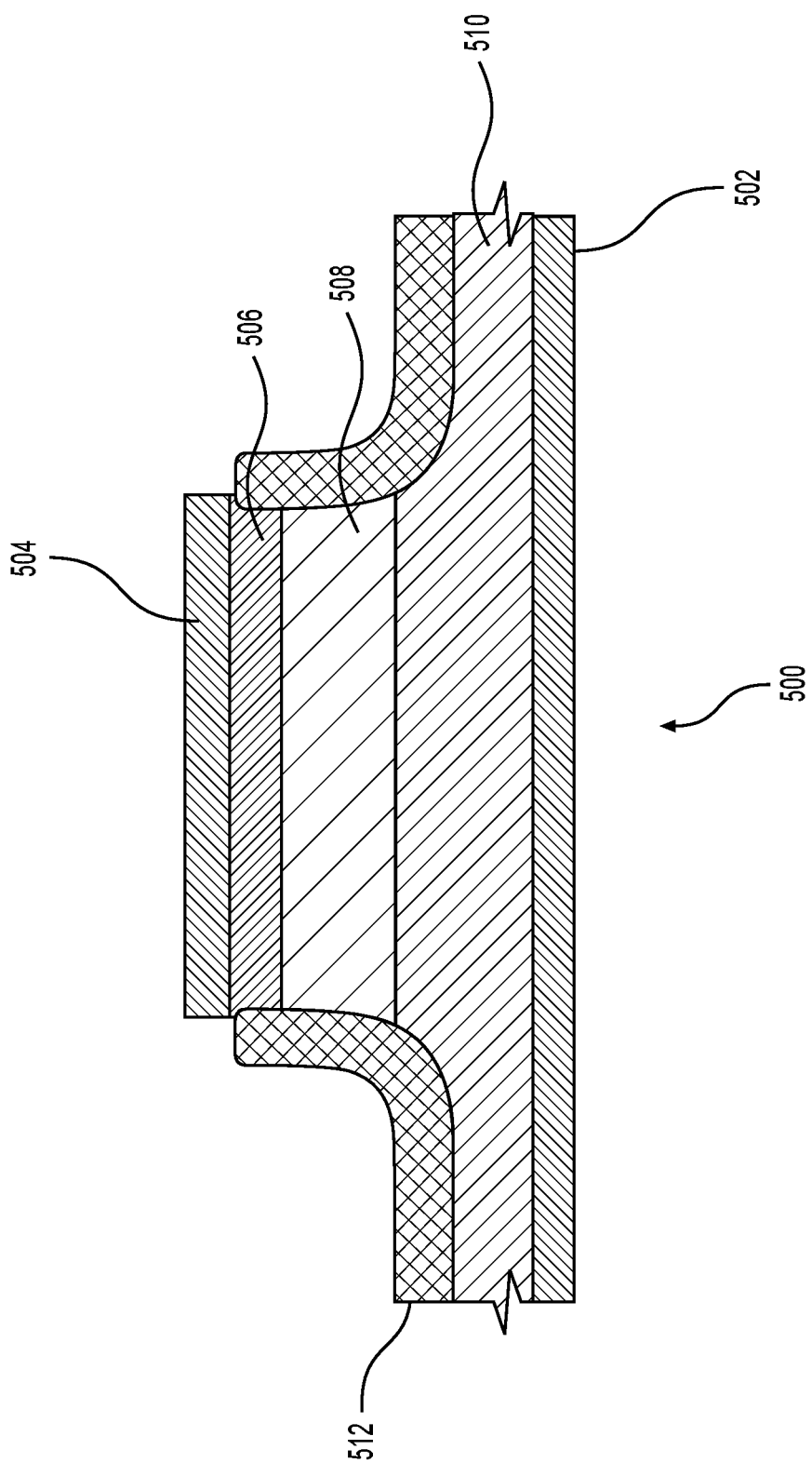
FIG. 5 illustrates a diode built with DLC for certain embodiments.

FIG. 5 illustrates a diode 500 for some embodiments. In some embodiments, diode 500 comprises first contact 502, second contact 504, p-layer 506, first n-layer 508, second n-layer 510, and oxide 512. In some embodiments, first n-layer 508 is a heavily doped n-layer, while second n-layer 510 is a lightly doped n-layer. Diode 500 is illustrated in FIG. 5 as a p-n junction diode having a mesa structure; however, diode 500 may instead be any type of diode such as an n-p-n (NPN) diode or a p-n-p (PNP) diode and have any type of structure such as a planar structure. A p-n junction diode may be formed by joining a p-type semiconducting layer to a n-type semiconducting layer. Typical p-type materials include, but are not limited to, boron, aluminum, gallium, indium, thallium, and combinations thereof. Typical n-type materials include, but are not limited to, phosphorous, arsenic, bismuth, antimony, and combinations thereof. In some embodiments, DLC 104 may be added or mixed with the n-type material (e.g., phosphorous) in at least one of first n-layer 508, second n-layer 510, or a combination thereof to build the p-n junction diode. In some embodiments, this arrangement results in a p-n junction diode that allows for electrical flow in only a single direction. In some embodiments, other dopants may be added to the DLC before adding the DLC to first p-layer 508 or second n-layer 510.

As an alternative to the p-n junction diode, diode 500 may be arranged with a second diode to form either an NPN diode or a PNP diode. These two diode arrangements may form a bipolar junction transistor (BJT). A BJT typically comprises two diodes that share a common region. In an NPN diode, the BJT shares the p-region between the two diodes, and in a PNP diode, the BJT shares the n-region between the two diodes. The three regions are often referred to as emitter, base, and collector. The emitter region is typically heavily doped in comparison to the other two regions, and the collector region is typically doped lighter in comparison to the base region. In a BJT, electrons flow from the emitter to the collector. In some embodiments, in either the NPN diode or the PNP diode, the n-region of the diode may comprise DLC 104 along with the n-type material such as phosphorous, arsenic, or antimony. One variant of a BJT is a heterojunction bipolar transistor (HBT) which may be able to handle signals comprising frequencies in the range of hundreds of gigahertz. Typically, HBTs comprise silicon-germanium; however, HBTs may instead be built using DLC 104 in place of the silicon in the silicon-germanium arrangement.

As another variation of diode 500, diode 500 may instead be a PIN diode. In a PIN diode arrangement, one of first n-layer 508 or second n-layer 510 may be omitted such that the PIN diode only comprises a single n-region. A PIN diode also comprises an undoped (i.e., intrinsic) semiconductor region between the n-region and p-layer 506. In some embodiments, a PIN diode 500 may comprise DLC 104 mixed with the n-type material, such as arsenic. In some embodiments, p-layer 506 and the n-type semiconducting layers are doped with various other materials. Broadly, diode 500 may comprise any variation of a junction diode, such as an avalanche diode, a constant-current diode, an LED, a Schottky diode, or a Zener diode.

Diode 500 may be utilized to build other electronic components such as transistors, LEDs, and integrated circuits. As described above, by replacing silicon with DLC 104 in an electronic component, the size of the resulting electronic component may be smaller than when built with silicon due to DLC 104 comprising atomically smaller carbon particles. Decreasing the size of diode 500 may allow for electronic components that use diodes to be miniaturized as well. As such, it is contemplated that smaller transistors, LEDs, and integrated circuits may result from replacing silicon with DLC 104 when building diodes 500 that are used to construct various electronic components.

Figure 6:
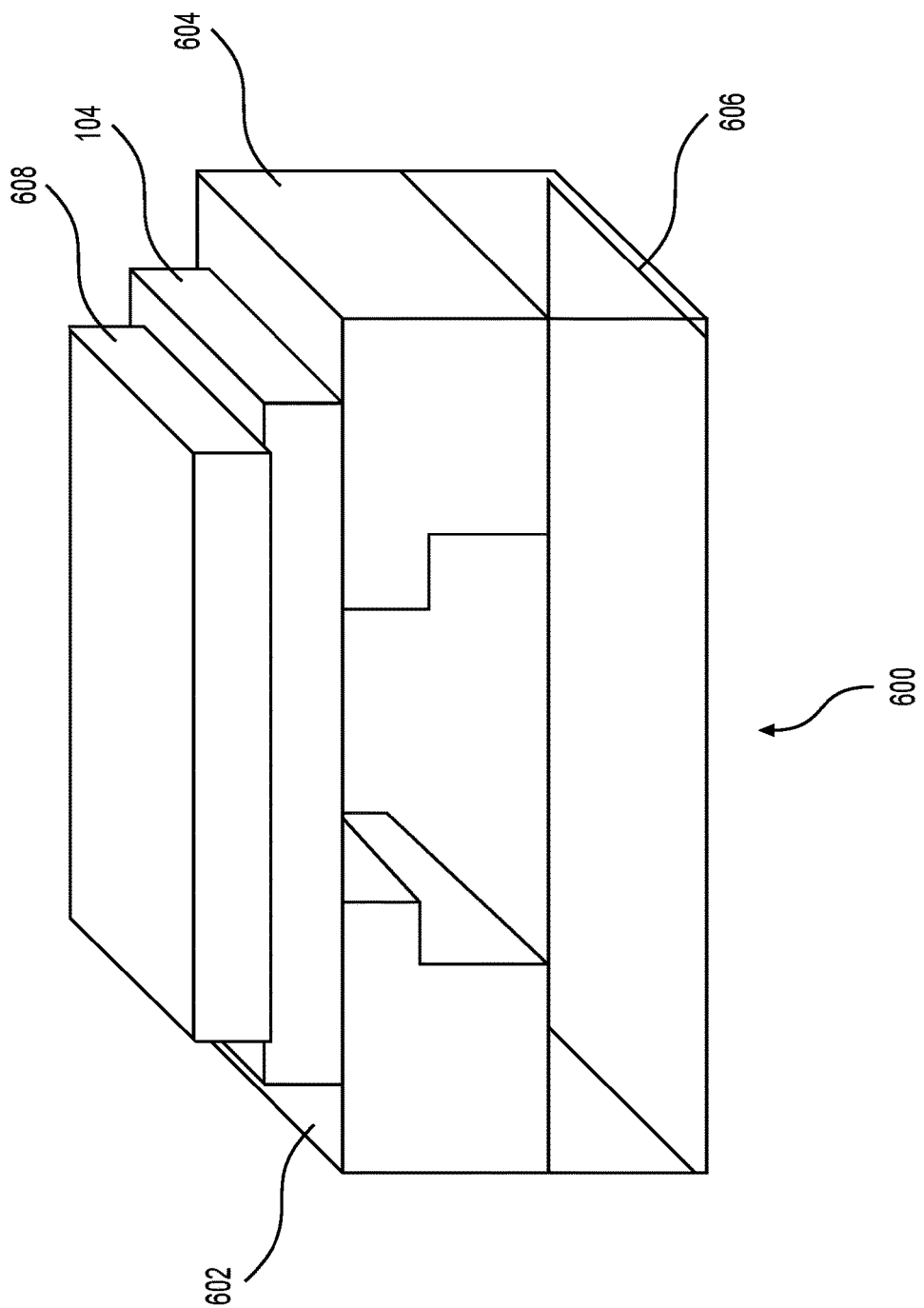
FIG. 6 illustrates a transistor built with DLC for certain embodiments.

FIG. 6 illustrates a transistor 600 for some embodiments. Generally, transistor 600 is formed by producing multiple layers of PNP diode 500, or NPN diode 500, or a combination thereof. As described above, this miniaturization of diode 500 due to the use of the atomically smaller DLC 104 may allow for transistor 600 to be produced on a smaller scale. Transistor 600 may comprise source 602, drain 604, body 606, gate 608, and DLC 104. In some embodiments, gate 608 comprises a gate electrode comprising one of aluminum, polysilicon, a refractory metal such as, tungsten, tantalum, or rhenium, or a silicide, such as molybdenum disilicide. In some embodiments, transistor 600 is a field-effect transistor (FET), such as a metal-oxide-semiconductor field-effect transistor (MOSFET), which may have a substantially similar arrangement to switch 400. In some embodiments, such as when transistor 600 is implemented within a digital circuit, transistor 600 serves as a switch. In a MOSFET arrangement, transistor 600 may be either a p-type MOSFET (pMOSFET) or an n-type MOSFET (nMOSFET). In an nMOSFET, transistor 600 may comprise source 602 and drain 604 comprising highly doped n+ regions while body 606 comprises a p region. A pMOSFET has the opposite architecture of the nMOSFET such that source 602 and drain 604 comprise highly doped p+ regions while body 606 comprises a n region. In either the pMOSFET or the nMOSFET arrangement, DLC 104 may be mixed with the n-type region.

Variations of the MOSFET architecture for transistor 600 are considered herein. Broadly, transistor 600 may be modified to be a floating-gate MOSFET, a power MOSFET, a thin-film transistor, a multi-gate field-effect transistor, or any other MOSFET architecture. In these MOSFET variations, DLC 104 may work as both a dielectric and as a semiconductor in source 602 and/or drain 604. For example, transistor 600 may take the form of a floating-gate MOSFET (FGMOS) in which gate 608 is electrically isolated from the rest of the transistor 600 parts such that gate 608 acts as a floating node. As described above, DLC 104 may serve as an insulating dielectric by modifying the hydrogen content and the $sp^2/sp^3$ ratio. Thus, in a FGMOS transistor 600 architecture, DLC 104 may be used to electrically isolate gate 608 by forming DLC 104 to have an appropriate $sp^2/sp^3$ ratio. In some embodiments, DLC 104 may be formed to function substantially like a semiconductor and be mixed with an n-type material and used for source 602 or drain 604 of the FGMOS transistor 600. DLC 104 may also be used in a thin-film transistor 600 architecture in which layers of a semiconductor (e.g., DLC 104 doped with an n-type material) are deposited onto a dielectric layer which, in turn, is deposited onto a non-conducting substrate (e.g., glass). Similar to the FGMOS architecture, in a thin-film transistor 600 architecture, DLC 104 may serve as both a semiconductor and a dielectric by modifying the $sp^2/sp^3$ ratio.

Alternatively, transistor 600 may comprise any other type of transistor such as a bipolar junction transistor (BJT) and variations thereof as described above. BJTs built with DLC 104 may be used in high-speed digital logic, as amplifiers, as temperature sensors, as logarithmic converters, and in other applications and may allow for the BJT to be smaller as compared to BJTs built with semiconductors that are atomically larger than carbon.

As another example, transistor 600 may comprise an insulated-gate bipolar transistor (IGBT) which may comprise four alternating layers (PNPN) controlled by gate 608. In some embodiments, gate 608 is a metal-oxide-semiconductor gate 608. In some embodiments, an IGBT may be used as a switch in various high-power applications, such as electric cars and air conditioning units. As described above, DLC 104 may be used in the IGBT embodiment in either of the n-regions or as insulation between the top p-region and between source 602 and drain 604. Broadly, transistor 600 may have any transistor arrangement and use DLC 104 as the insulating material between the channel and gate 608.

As described above, when used with transistor 600, DLC 104 may act as an insulating layer between source 602, drain 604, and gate 608. In some embodiments, DLC 104 is disposed beneath gate 608, thus insulating gate 608 from source 602 and drain 604. The insulation provided by DLC 104 may allow for the inversion channel formed between source 602 and drain 604 to be modulated. As described above, the dielectric constant of DLC 104 may be increased by increasing the thickness of the layer of DLC 104. In some embodiments, DLC 104 comprises a layer about less than about 200 nanometers thick when used with transistor 600.

Diode 500 and transistor 600 may be combined and integrated together to build a variety of structural electronics by depositing DLC 104 in layers. For example, diode 500 and transistor 600 may be used to build sensors and controls for various applications. In some embodiments, diode 500 and transistor 600, along with other necessary electronic components (e.g., resistor 100, capacitor 200, and/or inductor 300), may be combined to form structural electronics and used in 3D printed electronics. By constructing diode 500 and transistor 600 with the appropriate amount and layering of DLC 104, thus making the components smaller and lighter than typical components, these structural electronic components may be able to fit in small spaces.

In some embodiments, transistor 600 may serve as a sacrificial transistor. For example, transistor 600 may be placed within a joint and serve as both lubrication for the joint and as a transducer to measure various electrical properties, as will be discussed further with respect to FIG. 8. Similarly, transistor 600 could be placed within movable members of various machinery and/or robotics.

Figure 7:
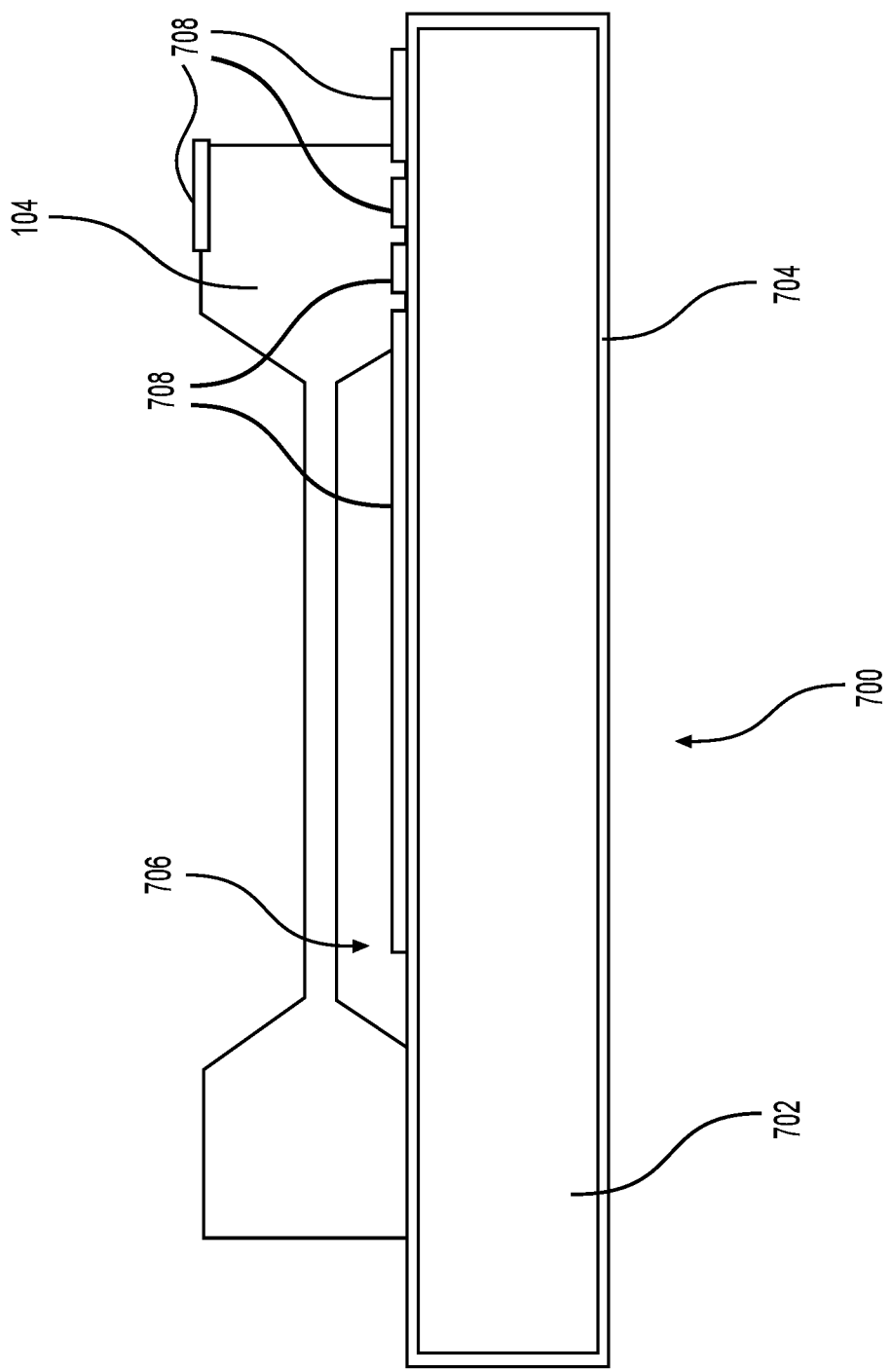
FIG. 7 illustrates a transducer built with DLC for certain embodiments.

FIG. 7 illustrates a cross-section of an exemplary transducer 700 built with DLC 104 for some embodiments. Transducer 700 may be formed in part from transistor 600 to measure various properties such as pressure, acceleration, heading, temperature, and the like using a microelectromechanical systems (MEMS) transducer 700. MEMS transducers 700 generally work by measuring the change in capacitance between two capacitive plates. When the distance between the two capacitive plates changes so will the capacitance. Based on the changed capacitance, various physical properties (e.g., pressure, acceleration, etc.) may be determined.

As illustrated, transducer 700 is a capacitive pressure transducer that works by converting an applied pressure to a signal. In some embodiments, pressure transducer 700 comprises plate 702, electrode 704, vacuum 706, bonding pads 708, and DLC 104. DLC 104 may have a first end that contacts bonding pads 708, a second end that contacts plate 702, and a middle region connecting the first end and the second end. In some embodiments, the middle region of DLC 104 in transducer 700 is thinner than both the first end and the second end such that a vacuum or air gap is formed between the middle region and electrode 704. Transducer 700 may be a MEMS transducer. In some embodiments, plate 702 is a glass plate or another non-conductive substrate. In some embodiments, electrode 704 is an aluminum electrode. In application, a mechanical force may be applied onto pressure transducer 700 which then causes bonding pads 708 to close, thus allowing a charge to be carried through the bonding pads 708, and a pressure may then be measured. DLC 104 may act as a diaphragm which deflects when pressure is applied. In some embodiments, transducer 700 is in a tuned circuit that changes frequency when a pressure is applied with the frequency being indicative of a value of applied pressure. For capacitive sensors, a smaller diaphragm may allow for a more sensitive transducer which can have a faster response time. As such, replacing silicon with DLC 104 may allow for a quicker and smaller pressure transducer 700 to be built.

In some embodiments, transducer 700 may instead be a piezoresistive sensor comprising a plurality of resistors 100. Each resistor 100 may be fabricated with DLC 104 as described above. In some embodiments, resistors 100 are connected in a Wheatstone bridge network to measure the change in resistance which is proportional to the change in strain. From the change in strain, the pressure may be derived.

Other MEMS sensors, such as accelerometers, gyroscopes, and magnetometers, inertial measurement units, temperature sensors, proximity sensors, and microphones are considered herein as well. For example, typical MEMS sensors comprise capacitors 200, diodes 500, and transistors 600, each of which may be built in part using DLC as described above. In an accelerometer embodiment, transducer 700 may further comprise a spring attached to a mass which may deform when a mechanical force is applied. When deformed, the spring may push the mass which in turn pushes two capacitive plates together, thus changing a capacitance between the two plates. The change in capacitance may then be converted into an acceleration.

Figure 8:
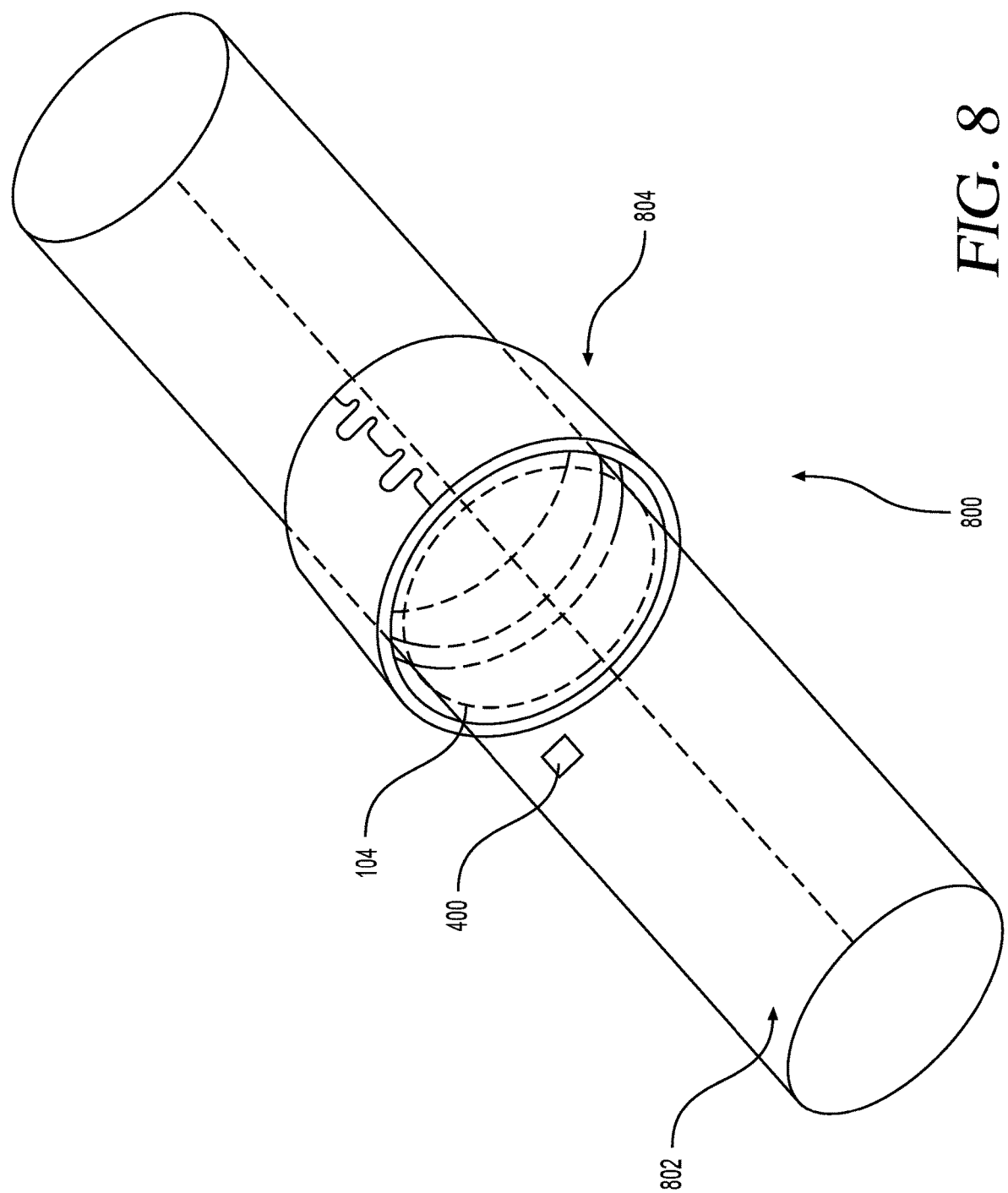
FIG. 8 illustrates an exemplary embodiment of using DLC as a transducer.

FIG. 8 illustrates an exemplary embodiment in which DLC 104 itself acts as a transducer. Due to the excellent tribological properties of DLC 104, electronic components built with DLC 104 may also take advantage of the lubrication provided by coatings parts with DLC 104. Illustrated in FIG. 8 is shaft-bushing assembly 800 comprising shaft 802 and bushing 804. The inside surface of bushing 804 is coated with a layer of DLC 104, and shaft 802 has switch 400 on the outer surface. In some embodiments, switch 400 is electrically connected to DLC 104.

In this example, DLC 104 is operating as lubrication for bushing 804. Consider, for example, that the performance of shaft-bushing assembly 800 is critical to the operation of a system in which shaft-bushing assembly 800 is being used. As such, it is desirable to be able to monitor the performance of the lubrication provided by DLC 104 because if the lubrication fails, the performance of shaft-bushing assembly 800 will be affected. As shaft-bushing assembly 800 undergoes multiple cycles over time, the DLC 104 layer may degrade, causing the lubrication provided by DLC 104 to decline. Monitoring the performance of typical lubrications such as oil or grease may be difficult without removing samples of the lubrication from bushing 804. However, due to the electrical properties of DLC 104, DLC 104 may act as both lubrication and a transducer to measure electrical properties. Therefore, in some embodiments, the performance of the lubrication provided by DLC 104 may also be detected by electrically connecting a sensor to DLC 104. For example, the resistance of DLC 104 may be measured within bushing 804. A change in the resistance of DLC 104 over time may be indicative of a change in the thickness and/or consistency of the DLC 104 layer, which may affect the lubrication performance provided by DLC 104. A drop in a measured resistance may indicate the DLC 104 is providing decreased lubrication, such that DLC 104 may need to be replaced or bushing 804 may need to be replaced.

Because DLC 104 is acting as a transducer, it may be necessary to electrically connect to DLC 104 in order to read the resistance of DLC 104. In some embodiments, switch 400 may be added to shaft-bushing assembly 800. In some embodiments, transistor 600 is used in place or in addition to switch 400. Switch 400 and/or transistor 600 may be used to electrically connect to DLC 104. Switch 400 may then be connected to a sensor or a controller configured to measure the resistance or another electrical property indicative of the lubrication performance provided by DLC 104. Switch 400 may allow for shaft-bushing assembly 800 to be monitored appropriately such that excess power is not used by continuously measuring the resistance of DLC 104. Switch 400 may be configured to close intermittently, thereby allowing the resistance to be measured periodically. For example, switch 400 may be configured to close once every hour or once every 10,000 cycles of shaft 802 rotating in bushing 804. As such, the performance of DLC 104 as a lubricant may be monitored effectively without having to remove samples of DLC 104 for testing and inspection.

The above example is not meant to limit DLC 104 to use as a transducer in only shaft-bushing assembly 800. Shaft-bushing assembly 800 may instead be replaced by another lubricated mechanical part or assembly such as a bearing, a cam, a cam follower, and the like. A substantially similar setup to the one illustrated in FIG. 8 could be used to monitor lubrication provided by DLC 104 based on measuring the resistance of DLC 104. As another example, the effectiveness of lubrication and wear resistance provided by DLC on a machining tool such as a lathe or a mill could be measured by electrically connecting to DLC 104. Broadly, any system that utilizes DLC 104 for its tribological properties to prevent abrasive or adhesive wear may benefit from monitoring the resistance of DLC 104 by electrically connecting to it via switch 400 or transistor 600.

Figure 9:
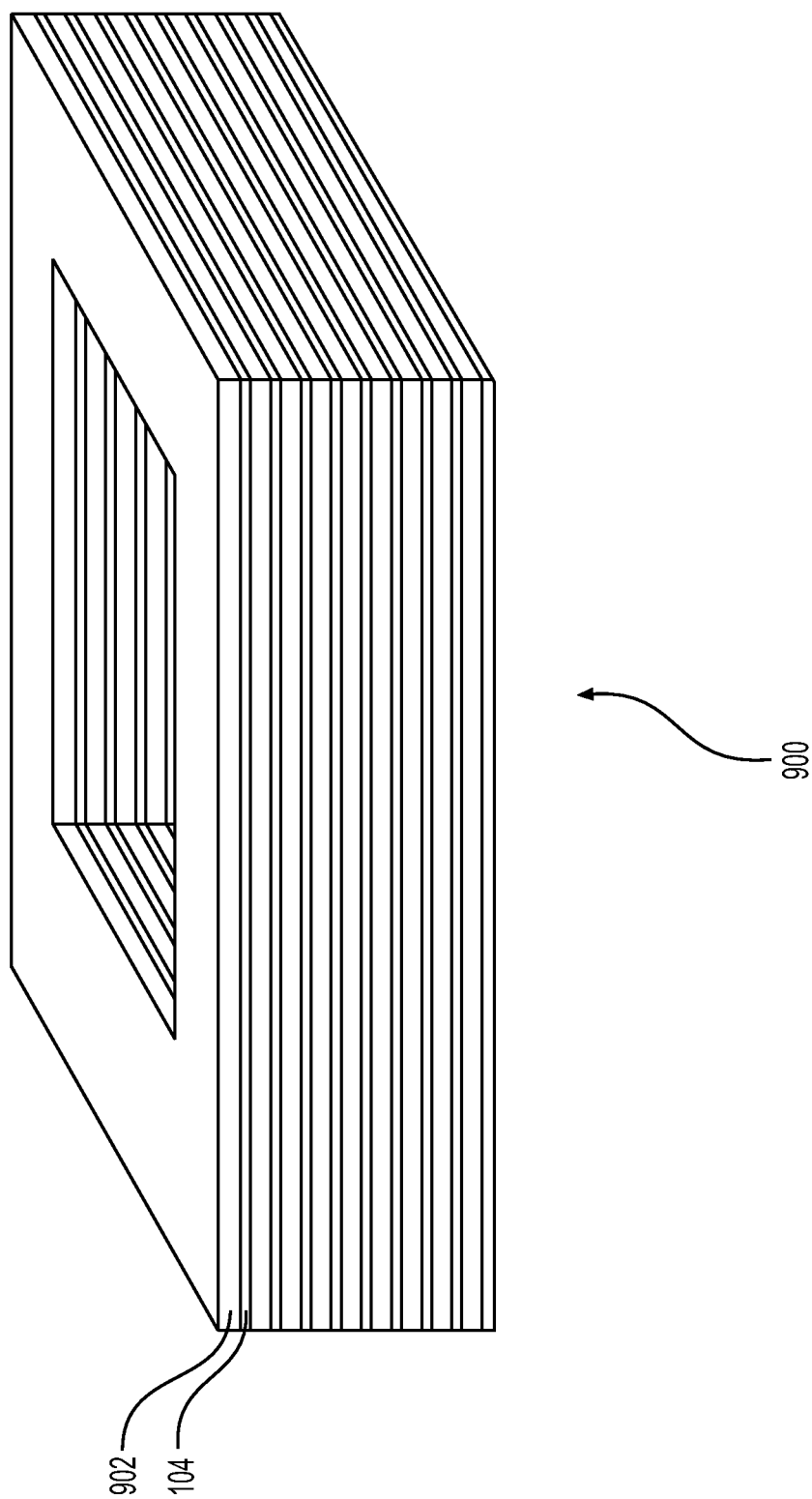
FIG. 9 illustrates a laminated magnetic core built using DLC for certain embodiments.

FIG. 9 illustrates a laminated core 900 for some embodiments. Laminated core 900 may be used in various applications such as in motors or transformers. An electric motor typically comprises a rotor, bearings, a stator, windings, and a commutator. Electric motors often suffer from losses due to eddy currents in the rotor or stator. To address these losses, motors may often be manufactured such that the rotor or stator has a plurality of striations or laminations to reduce the surface area the eddy current can travel. Typically, rotor laminations are comprised of multiple thin layers of metal. The reduction of eddy currents in the rotor is limited by how thin the laminations can be made. As illustrated, laminated core 900 comprises laminations 902 and DLC 104. In some embodiments, laminated core 900 may be a laminated magnetic core. DLC 104 may be applied as a layer or coating to laminations 902 to provide insulation. Laminations 902 may comprise a sheet of metal, such as silicon steel. Laminations may comprise a thin layer, having a thickness of about 50 nanometers to about 3 microns. In some embodiments, DLC 104 may have a thickness of about 5 nanometers to about 1 micron. By providing a coating or layer of DLC 104 onto a laminated rotor sheet, such as laminations 902, the lamination may be made thinner than conventional laminations without sacrificing performance of the motor. In some embodiments, laminated core 900 may comprise multiple planar layers of laminations 902 with multiple distinct layers of DLC 104. In some embodiments, laminated core 900 may comprise a top surface having a central opening through the core, as seen in FIG. 9. In some embodiments, the top surface of the top lamination 902 may not have DLC 104 coated thereon. In some embodiments, the layer of DLC 104 may extend over an entire surface of lamination 902, as illustrated in FIG. 9, or only over a partial area thereof. In some embodiments, DLC 104 may be provided only between some of the layers of laminations 902, such as every other layer, and an alternative conventional insulation material may be provided between other layers. In some embodiments, the layer of DLC 104 may extend over a portion of a side surface of laminations 902. As such, it is contemplated that smaller motors may be achieved by applying DLC 104 to the stator or rotor laminations.

In some embodiments, laminated core 900 may be used as a multilayer magnetic circuit that may also suffer losses due to eddy currents. To help reduce eddy current losses, conductors may be striated or laminated to reduce the area that eddy currents can flow. Further, some insulating coatings are often chosen for their lubrication benefit as well as their insulation properties, both of which may be provided by replacing the insulating material with DLC 104 as illustrated in FIG. 9.

Figure 10:
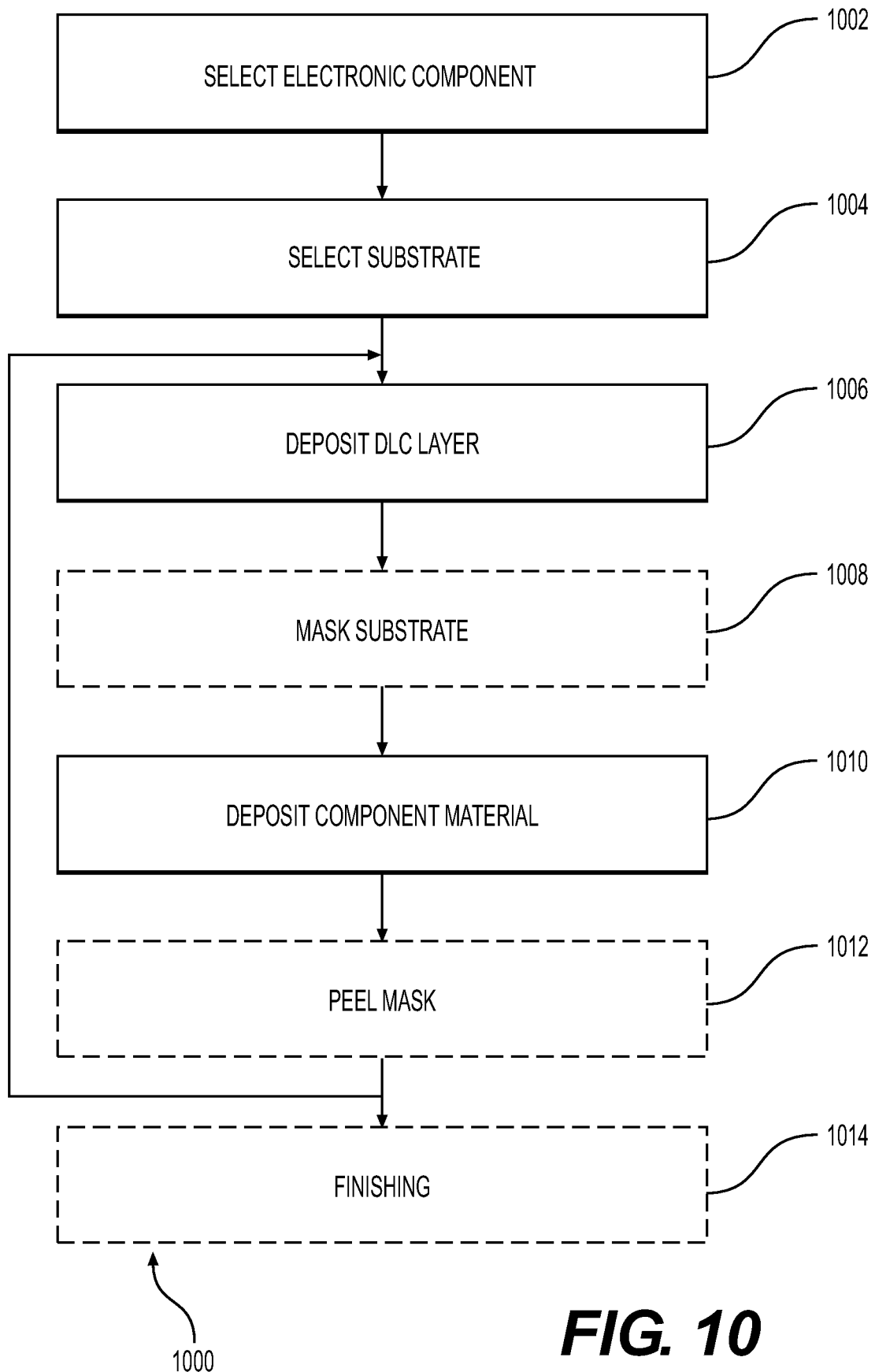
FIG. 10 illustrates an exemplary method of manufacturing passive and active electronic components using DLC.

FIG. 10 illustrates an exemplary method of building passive and active electronic components for some embodiments. At step 1002, the electronic component to be built may be selected. The electronic component may be any of resistor 100, capacitor 200, inductor 300, switch 400, diode 500, transistor 600, transducer 700, or any other passive or active electronic component. Such an electronic component may be used in the applications, such as shaft-bushing assembly 800 or laminated core 900. Based on the selected electronic component, the electronic component material may change, as will be discussed below.

At step 1004, the substrate for the electronic component may be selected. In some embodiments, the substrate is dependent upon the specific electronic component. For example, the substrate may be a typical substrate for manufacturing electronics on, such as a polyimide (e.g., Kapton®), a metal, a doped metal, epoxy, plastics, or a silicon wafer. In some embodiments, the substrate is a non-conductive substrate to prevent electrons flowing through the substrate material. The substrate may be planar or non-planar, such as spherical, or the substrate may be flexible. In some embodiments, the substrate may be prepared prior to any deposition operation to promote adhesion with DLC 104. For example, cleaning of the substrate surface may be performed with one or more treatments known to those skilled in the art, such as a plasma-based treatment. In some embodiments, cleaning treatments are used to remove residual processing materials on the substrate (e.g., from processing of PCBs) and to dry the substrate surface. In some embodiments, plasma-based treatments may be used to help activate the surface of the substrate prior to deposition of DLC. Exemplary cleaning processes including wiping the substrate with a lint-free cloth, spraying the substrate with compressed air or nitrogen gas, applying plasma treatment, and applying an in-situ argon plasma etch under vacuum. The in-situ argon plasma etch helps remove any oxides on metal surfaces and serves as a surface activation technique. DLC deposition may immediately follow the argon plasma etch without breaking vacuum. Other types of treatments may be used depending on the materials of the substrate without departing from the scope hereof. A cleaner substrate surface generally provides better adhesion of the DLC. However, the DLC coating may be deposited directly onto the substrate without any pretreatment of the substrate surface, so long as the substrate surface is substantially clean, since the DLC material bonds well to most substrate materials without pretreatment.

Next at step 1006, a base layer of DLC 104 may be deposited onto a substrate. In some embodiments, the base layer is deposited to be about 3 microns thick. The base layer may cover the entirety of the substrate or may cover a portion of the substrate. As described above, DLC 104 may be deposited using chemical vapor deposition methods such as PECVD, atomic layer deposition and variations thereof, cathodic vacuum arc deposition, or ion deposition methods such as ion sputtering. When ion beam sputtering is used, the thickness of DLC 104 may be about 10 nm thick. Broadly, any physical vapor deposition method or chemical vapor deposition method capable of depositing DLC 104 at the requisite thickness for the selected electronic component may be used. In some embodiments, the deposition method may be modified to adjust the desired hydrogen content of DLC 104. In some embodiments, multiple layers of DLC 104 may be deposited at step 1004 to achieve the desired electronic property for DLC 104. For example, multiple layers of DLC 104 may be required when building capacitor 200 to obtain the desired dielectric constant for the DLC 104 as the dielectric contact may increase with increasing thickness of DLC 104.

In some embodiments, DLC 104 may be doped with various materials. Doping DLC 104 may help reduce the dielectric standoff of DLC 104. Various dopants such as silicon, iron, silver, copper, nickel, titanium, tungsten, or other metallics may be added to DLC 104. Silicon may be used to soften DLC 104, which may help to reduce any cracks, microfractures, or other damage caused by internal stresses within DLC 104, which may therefore enable thicker layers of DLC to be formed. Doping the DLC material may also be used to improve adhesion of the DLC layer to a substrate or other electrical component material. Various dopants, such as metal dopants, may also increase the dielectric standoff of DLC 104. As described above, doping the DLC material may be used to alter the $sp^2/sp^3$ ratio of DLC 104, which may be varied depending upon the electronic component selected at step 1002. When DLC 104 is used as a semiconductor, DLC 104 may be prepared to have more $sp^3$ carbon bonds than $sp^2$ carbon bonds. Alternatively, when it is desired to take advantage of the dielectric properties of DLC 104, DLC 104 may be configured to have more $sp^2$ carbon bonds than $sp^3$ carbon bonds.

At optional step 1008, the substrate, which may now comprise at least one layer of DLC 104, may be masked. In some embodiments, a photomask or a shadow mask may be used to mask the substrate. In some embodiments, a polyimide masking layer or a metal masking layer may be applied. The substrate may be masked to keep areas that are desired to comprise DLC 104 free from other materials. For example, portions of the substrate may be masked to provide insulation or to leave room for contact switches in a circuit. In some embodiments, the masking is designed to leave room for traces to be deposited.

At step 1010, the electronic component material may be deposited onto the substrate. The electronic component material may depend on the electronic component being built. For example, if resistor 100 is being fabricated, a gold trace may be laid down. The electronic component material may be deposited using PECVD, ion beam sputtering, atomic layer deposition, or another appropriate deposition method. In some embodiments, the electronic component material may be deposited in a thickness range of about 5 nm to about 5000 nm. As described above, resistors may comprise a resistive material such as a cermet. For capacitor 200, the electronic component material may comprise a conductive material such as aluminum or tantalum. For inductor 300, the electronic component material may be copper. For switch 400, diode 500, and transistor 600, the electronic component material may be the p-type and/or n-type semiconducting materials, which may be mixed with DLC 104 as described above. Step 1008 may be performed with multiple electronic component materials. For example, a circuit comprising resistor 100, capacitor 200, and inductor 300 may be manufactured to build a circuit or the like.

Once the appropriate amount of electronic component material has been deposited, the process may then move to optional step 1012, where the masking layer may be peeled or otherwise removed. Thus, the substrate may comprise the DLC layer deposited at step 1006 and the electronic component material deposited onto the unmasked portion of the substrate at step 1008. Thereafter, method 1000 may return to step 1006 where another DLC layer is deposited. At this point, the process may repeat as many times as necessary to produce the final component. The final component may comprise a plurality of DLC layers with multiple electronic components built between the plurality of DLC layers. This process may allow for the printing of structural electronics that can be used in various applications and may be printed to be smaller than typical structural electronics that comprise silicon, polyimide films, and the like that are atomically larger than DLC 104.

Because of the ability to apply layers of DLC 104 thinly and evenly on the substrate, various materials may be effectively segregated on the substrate without any degradation of electric constants or electric signals between different materials in the substrate. For example, it is often undesirable for a cathode and an anode (e.g., copper and aluminum) to be substantially near each other within the same substrate because they tend to oxidize, leading to galvanic corrosion. However, by applying a thin layer of DLC 104 between the cathode and the anode, the two may coexist without any substantial deficiencies.

Lastly, at optional step 1014, the electronic component may undergo a finishing process. In some embodiments, the electronic component undergoes a cleaning process after manufacture is complete. In some embodiments, the cleaning process is substantially similar to the cleaning process for the substrate as described above with respect to step 1004. In some embodiments, the electronic component is marked to indicate an associated electrical property. For example, resistor 100 may be marked to indicate the resistance value. As another example, transistor 600 may be packaged or attached to a die. In some embodiments, transistor 600 undergoes a bonding process, such as wire and/or thermosonic bonding. In some embodiments, the electronic component is cured after deposition is completed to harden the deposited materials. Other finishing processes may include standard surface finishing processes, such as polishing, powder coating, electroplating, or any combination thereof.

Method 1000 may also provide advantages in streamlining the manufacturing of various electronics. For example, some electronic devices comprise a variety of resistors 100, capacitors 200, and inductors 300 along with a silicon integrated chip soldered onto a circuit board comprising various conductors and insulators. Each of the various components may be manufactured using various techniques and then assembled onto the circuit board. By additively manufacturing each of the components using the various methods described above, the construction of various components may be streamlined and performed using substantially the same technique and the same equipment. Additionally, the electronics may be built into or onto structural members of various structures and allow for the performance of the structures to be monitored.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A transistor, comprising:
  a body region having a first end-region and a second end-region, the body region comprising at least one p-type dopant;
  a source terminal connected to the first end-region;
  a drain terminal connected to the second end-region,
  wherein the source terminal and the drain terminal comprise at least one n-type dopant mixed with semiconducting diamond-like carbon (DLC);
  a DLC layer disposed on top of and extending between the source terminal and the drain terminal; and
  a gate terminal disposed on top of the DLC layer,
  wherein the DLC layer electrically isolates the gate terminal from the source terminal and the drain terminal.

2. The transistor of claim 1, wherein the DLC layer is doped with at least one of iron, silver, copper, nickel, or titanium.

3. The transistor of claim 1, wherein the DLC layer is doped with silicon.

4. The transistor of claim 1, wherein the DLC layer comprises a thickness in a range of 5 nanometers to 5 microns.

5. The transistor of claim 1, wherein the gate terminal comprises polysilicon.

6. The transistor of claim 1, wherein an $sp^2/sp^3$ ratio of the semiconducting DLC is configured for electricity to pass through the semiconducting DLC via hopping conductivity.

7. The transistor of claim 1, wherein the DLC layer comprises a hydrogen content in a range of 20% to 35%.

8. A transistor, comprising:
  a body region having a first end-region and a second end-region, the body region comprising at least one p-type dopant;
  a source terminal connected to the first end-region;
  a drain terminal connected to the second end-region,
  wherein the source terminal and the drain terminal comprise at least one n-type dopant mixed with semiconducting diamond-like carbon (DLC)
  a DLC layer disposed on top of and extending between the source terminal and the drain terminal; and
  a gate terminal comprising a refractory metal that is disposed on top of the DLC layer,
  wherein the DLC layer electrically isolates the gate terminal from the source terminal and the drain terminal.

9. The transistor of claim 8, wherein the DLC layer is doped with at least one of iron, silver, copper, nickel, or titanium.

10. The transistor of claim 8, wherein the at least one n-type dopant comprises at least one of phosphorous, arsenic, bismuth, or antimony.

11. The transistor of claim 8, wherein an $sp^2/sp^3$ ratio of the semiconducting DLC is configured for electricity to pass through the semiconducting DLC via hopping conductivity.

12. The transistor of claim 8, wherein the DLC layer comprises a hydrogen content in a range of 20% to 35%.

13. A transistor, comprising:
  a body region having a first end-region and a second end-region, the body region comprising at least one p-type dopant;
  a source terminal connected to the first end-region;
  a drain terminal connected to the second end-region,
  wherein the source terminal and the drain terminal comprise at least one n-type dopant mixed with semiconducting diamond-like carbon (DLC)
  a DLC layer disposed on top of and extending between the source terminal and the drain terminal; and
  a gate terminal comprising a silicide that is disposed on top of the DLC layer,
  wherein the DLC layer electrically isolates the gate terminal from the source terminal and the drain terminal.

14. The transistor of claim 13, wherein the DLC layer is doped with at least one of iron, silver, copper, nickel, or titanium.

15. The transistor of claim 13, wherein the at least one n-type dopant comprises at least one of phosphorous, arsenic, bismuth, or antimony.

16. The transistor of claim 13, wherein an $sp^2/sp^3$ ratio of the semiconducting DLC is configured for electricity to pass through the semiconducting DLC via hopping conductivity.

17. The transistor of claim 13, wherein the DLC layer comprises a hydrogen content in a range of 20% to 35%.

18. The transistor of claim 13, wherein the DLC layer is doped with silicon.

19. A transistor, comprising:
  a body region having a first end-region and a second end-region, the body region comprising at least one p-type dopant;
  a source terminal connected to the first end-region;
  a drain terminal connected to the second end-region, wherein the source terminal and the drain terminal comprise at least one n-type dopant mixed with semiconducting diamond-like carbon (DLC)

a DLC layer disposed on top of and extending between the source terminal and the drain terminal; and a gate terminal comprising a silicide that is disposed on top of the DLC layer, wherein the DLC layer electrically isolates the gate terminal from the source terminal and the drain terminal.

20. The transistor of claim 19, wherein the DLC layer is doped with silicon.

* * * * *